(12) United States Patent
Nakayama et al.

(10) Patent No.: US 8,040,043 B2
(45) Date of Patent: Oct. 18, 2011

(54) DISPLAY DEVICE AND LUMINOUS PANEL

(75) Inventors: Takahiro Nakayama, Hitachinaka (JP);
Hajime Murakami, Tokyo (JP);
Sukekazu Aratani, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 488 days.

(21) Appl. No.: 11/471,473

(22) Filed: Jun. 21, 2006

(65) Prior Publication Data

US 2006/0291188 A1 Dec. 28, 2006

(30) Foreign Application Priority Data

Jun. 23, 2005 (JP) ................................ 2005-183867

(51) Int. Cl.
*H01J 1/62* (2006.01)
(52) U.S. Cl. ...................................................... 313/504
(58) Field of Classification Search .......... 313/498–512; 315/169.1, 169.3; 428/690–691, 917; 438/26–29, 438/34, 82; 257/40, 72, 98–100, 642–643, 257/759; 427/66, 532–535, 539
See application file for complete search history.

(56) References Cited

U.S. PATENT DOCUMENTS

| | | | | |
|---|---|---|---|---|
| 6,133,691 A * | 10/2000 | Nakayama et al. | ............ | 313/504 |
| 6,747,618 B2 * | 6/2004 | Arnold et al. | .................. | 345/77 |
| 6,893,743 B2 * | 5/2005 | Sato et al. | .................... | 428/690 |
| 7,166,959 B2 * | 1/2007 | Suzuki et al. | ................. | 313/504 |
| 7,173,369 B2 * | 2/2007 | Forrest et al. | ................. | 313/503 |
| 2004/0160154 A1 * | 8/2004 | Nishimura et al. | ........... | 313/113 |
| 2005/0046336 A1 * | 3/2005 | Utsumi et al. | ................ | 313/501 |
| 2005/0067945 A1 * | 3/2005 | Nishikawa et al. | ........... | 313/501 |
| 2005/0099113 A1 * | 5/2005 | Yamada | ........................ | 313/504 |
| 2005/0122037 A1 * | 6/2005 | Utsumi et al. | ................ | 313/504 |
| 2006/0238118 A1 * | 10/2006 | Spindler | ....................... | 313/506 |

FOREIGN PATENT DOCUMENTS

| JP | 2000-098191 | 4/2000 |
|---|---|---|
| JP | 2001-324685 | 11/2001 |
| JP | 2002-93583 | 3/2002 |
| JP | 2004-146221 | 5/2004 |

* cited by examiner

*Primary Examiner* — Toan Ton
*Assistant Examiner* — Zachary Snyder
(74) *Attorney, Agent, or Firm* — Antonelli, Terry, Stout & Kraus, LLP.

(57) ABSTRACT

In an organic EL panel for enhancing luminous efficiency and utilization efficiency of light, monochromatic RGB lights emitted from the organic EL panel in which organic EL elements optimum for three monochromatic primary RGB colors are patterned in a stripe-like manner, are adjusted by a liquid crystal panel so as to obtain monochromatic RGB output lights. In addition, the three monochromatic RGB lights are led through color filters with black matrices in order to enhance the color purities and visibilities of the adjusted lights.

10 Claims, 6 Drawing Sheets

LINE DIRECTION OF STRIPES

DISPLAY DEVICE AND LUMINOUS PANEL

FIELD OF THE INVENTION

The present invention relates to a display device using a thin film luminous element, and a luminous panel and an optical device such as an illumination panel which utilize the luminous element.

DESCRIPTION OF THE RELATED ART

Conventionally, a full color display panel using an optical shutter function element such as a liquid crystal element which controls the intensity of light transmitted therethrough, performs a multicolor display or a full color display with the use of three primary color light beams which can be obtained by transmitting white light from a white light source such as a fluorescent lamp (a wide wavelength range light emitter) used as a backlight, through red (R), green (G) and blue (B) filters.

In these years, thin film surface emitting elements including an organic EL luminous element have been practically used, and has been expected to be used as a backlight, instead of the fluorescent lamp. However, emission spectra of the organic EL luminous element cannot sufficiently cover all visible ranges. Thus, there has been proposed the utilization of a wide wavelength range emitter which is formed by laminating two or more kinds of luminous elements having different emission wavelength ranges one upon another or mingling them to one another so as to have emission light components with sufficiently high intensities over a wide wavelength range (ideally covering an overall visible light range). In the most of these cases, monochromatic organic EL elements are used to obtain emission of "white color light". For example, JP-A-2002-93583 discloses a method of obtaining a planer white color light source by laminating two kinds of luminous layers one upon another, and by energizing both layers.

However, this method is contrary to the improvement in efficiency of drive energy for the panel due to two causes. The first one of them is lowering of the efficiency in the case of a wide wavelength range emitter which is constituted by using a plurality of luminous center points of monochromatic organic EL luminous elements, and the second one of them is using the wide wavelength light to be incident upon an optical shutter function element such as an liquid crystal element.

At first, the first cause will be explained. The monochromatic organic EL element materializes charge balance and highly efficient luminous transition in an energized condition by optimizing a structure concerning film thicknesses of layers, a density of luminous center points and so on, thereby it is possible to obtain a transition with a high degree of luminous efficiency which is nearly equal to a theoretic critical limit.

In order to materialize the wide luminous wavelength range organic EL luminous element from luminous center points of monochromatic organic EL elements, two or more kinds of monochromatic luminous center points on the short wavelength side and on the long wavelength side are mingled to one another or laminated one upon another to form it. However, in this wide luminous wavelength organic EL element, even though structures which are monochromatically optimized are mixed or laminated one upon another in a simple manner, there would be, in particular, caused such a phenomenon that the luminous intensity on the short wavelength side relatively lowers.

This is caused, for example, by such a fact that a transition of a narrow energy gap corresponding to long wavelength luminosity is likely to easily occur if the narrow energy gap is adjacent to a wide energy gap in a recombination luminous range. In addition, it would be caused by occurrence of such a phenomenon that luminosity once caused on the short wavelength side is absorbed by long wavelength side luminous center points so as to carry out light-light conversion (photoluminescence, PL) of it to the long wavelength side luminosity.

Thus, in a wide wavelength range organic EL element used for backlight, the density of luminous center points and the film thickness are readjusted so as to relatively increase the short wavelength side luminosity corresponding to a transition of a wide energy gap so as to improve its "whiteness". This is contrary to the improvement in efficiency which can be obtained by optimization of the structure in the monochromatic organic EL element, and as a result, the efficiency of the wide wavelength range organic EL element is lower than that of the monochromatic EL element by a large percentage.

Then, the second cause is resulted from such a fact that the wide wavelength range luminosity is used for being incident upon an optical shutter function element such as a liquid crystal. That is, inherently, as the common property of organic EL elements, nearly monochromatic luminosity lights are mixed in a single luminous element so as to obtain a wide wavelength range, and then, are cut off by RGB filters in front thereof so as to make them monochromatic before final emergence from the panel. Thus, light which has been extended over an entire visual range is uselessly cut off through RGB pixels by about ⅔.

In summary, the efficiency of a full color display panel using organic EL elements, as a white backlight source, is lowered through a process of mixing nearly monochromatic lights in a single luminous element so as to obtain a wide wavelength range, and further, a loss is caused when the lights are made to be monochromatic through RGB filters before it is emerged. Thus, if it is considered that the loss by the second cause is 67% (about ⅔) of the efficiency while a loss by the first cause is about 20% (although it may not be precise since it depends upon a used material), the efficiency is lowered by not less than 70% in total.

BRIEF SUMMARY OF THE INVENTION

An object of the present invention is to provide a light source utilizing an organic EL panel having a different luminous color area pattern, for allowing light to be incident upon an optical shutter function element such as a liquid crystal element, used in a display device.

In this configuration, monochromatic organic EL elements are used in order to prevent lowering of efficiency upon whitening of light, and further, there would not be caused such a loss that color lights are uselessly loosen respectively through front RGB filters by ⅓, thereby it is possible to enhance the efficiency.

Also, the present invention can be utilized for a luminous display, a luminous element, an optical device, a communication optical element, a lighting plate, and the like.

Other objects, features and advantages of the invention will become apparent from the following description of the embodiments of the invention taken in conjunction with the accompanying drawings.

DETAILED DESCRIPTION OF THE INVENTION

Explanation will be hereinbelow made of preferred embodiments of the present invention with reference to the drawings.

Embodiment 1

Figure 1:
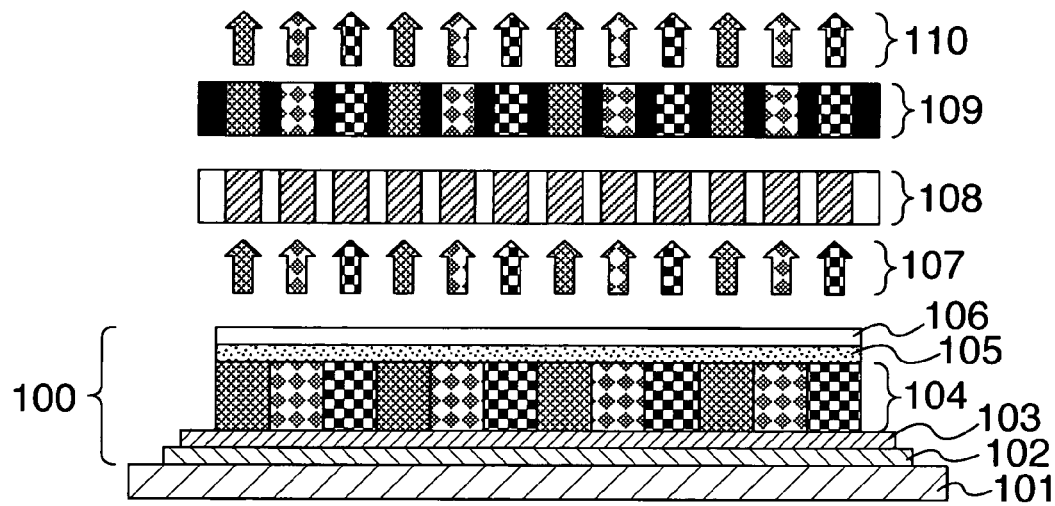
FIG. 1 is a schematic view illustrating a first embodiment of a display device according to the present invention.

FIG. 1 is a schematic view illustrating a display device utilizing an organic EL panel (RGB three color area pattern organic EL panel) in which organic EL elements that are optimum for monochromatic colors respective for three primary RGB colors are patterned in a stripe-like manner in conformity with light incidence upon an optical shutter function element such as a liquid crystal element.

In FIG. 1, upon a liquid crystal panel 108 having optical shutter function elements are incident monochromatic RGB color lights 107, which are emitted from an organic EL panel 100 in which a metal electrode film 102 made of Al or the like and having a reflective function, an electron transfer layer 103 formed of a thin organic film, RGB organic thin film luminous layers 104 which are formed in a stripe-like pattern, being parallel with one another, a hole transfer layer 105 formed of a thin organic film, and a transparent electrode 106 made of ITO are formed in the mentioned order on a substrate 101. Accordingly, the intensities of the monochromatic RGB lights 107 are adjusted by the shutter function elements of the liquid crystal panel 108.

The thus adjusted monochromatic RGB lights 107 are then led through a color filter 109 composed of RGB filters and a black matrix which is filled in a gap among the RGB filters, and accordingly, are turned into monochromatic RGB output lights which are finally outputted. This color filter 109 have a function capable of holding and adjusting color purities of the finally outputted monochromatic RGB output lights 110, and a function capable of restraining incidence of external light so as to enhance the color purities and visibility. However, these functions may not be used in a display device in which the color purities and the visibility are not important.

Further, vertical lines depicted in the liquid crystal panel 108 schematically show optical paths through which the monochromatic RGB lights 107 incident thereupon underneath and output lights emergent upward therefrom pass, and do not always give a meaning of formation of a blocked independent structure. The same may be also said to the color filter 109.

Figure 2:
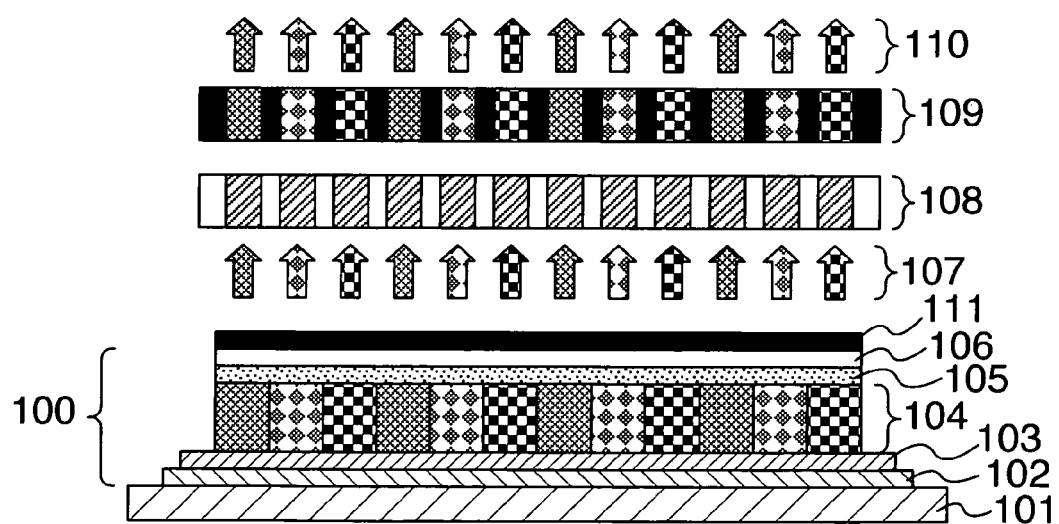
FIG. 2 is a schematic view illustrating the display device in which an organic EL panel 100 shown in FIG. 1 has a resonator structure.

Further, as shown in FIG. 2, a protecting film 111 having a semitransparent reflecting function is provided in front of the luminosity so as to allow the organic EL elements in the organic EL panel 100 to have a resonator structure, thereby it is possible to enhance the directivity of luminosity of the organic EL elements, and to enhance the efficiency of optical injection into the optical shutter function element so as to make color adjustment. Simultaneously, it is possible to aim at enhancing the intensity of light in view of the effect by the resonator. The length of the resonator may be adjusted for each of pixels by arbitrarily changing the thickness of the film constituting the resonator. Further, it is also possible to allow the protecting film to have a water-proof and moisture-proof function for the liquid crystal panel.

By setting the reflectivity of the protecting film 111 having the semitransparent reflecting function, to a higher value, the monochromatic RGB output lights may have directivity so as to materialize a display device which is hard to be sidewise visible. Further, in order to widen the practical viewing angle thereof, there may be inserted a diffusion plate or the like through which the monochromatic RGB output lights 110 are taken out. Such a conventional optical design that a deflecting plate or a phase difference plate is used in the liquid crystal panel 108 may be taken in order to enhance the visibility, depending upon its use purpose.

Further, in order to efficiently inject electrons into the electron transfer layer 103 from the metal electrode film 102 having a reflecting function or the like, a layer made of LiF, for adjusting a value of a working function may be inserted in the interface thereof, as is conventionally well-known.

Figure 3:
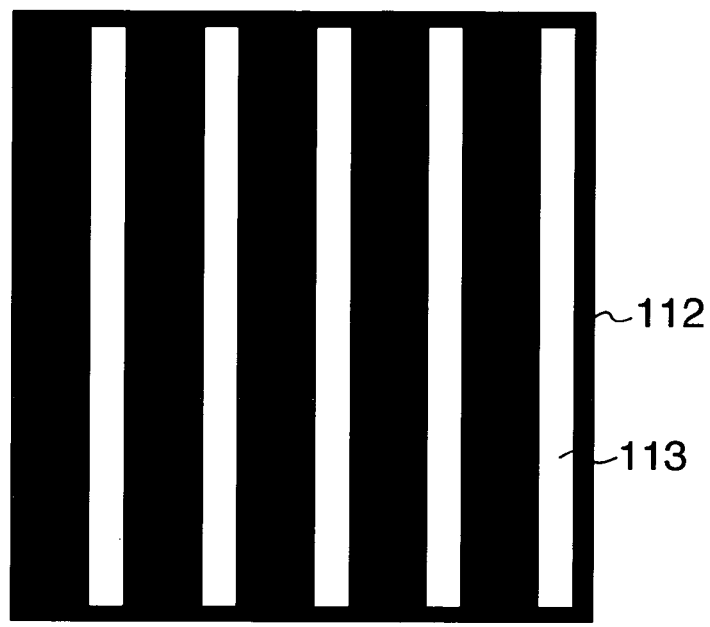
FIG. 3 is a deposition mask which is used during formation of the organic EL panel shown in FIGS. 1 and 2 by deposition.

In order to form the organic EL panel 100 having a RGB three color area pattern, a mask having apertures 113 of ⅓ is used, as, for example, shown in FIG. 3. The mask is shifted transversely, and each of luminous materials is deposited at a respective position of RGB luminous portions. The mask is composed of blocking portions (mask portions) 112 and apertures (film forming portions) 113. In this case, the mask should be precisely positioned in order to prevent occurrence of short-circuiting between upper and lower films and the like.

Embodiment 2

Figure 4:
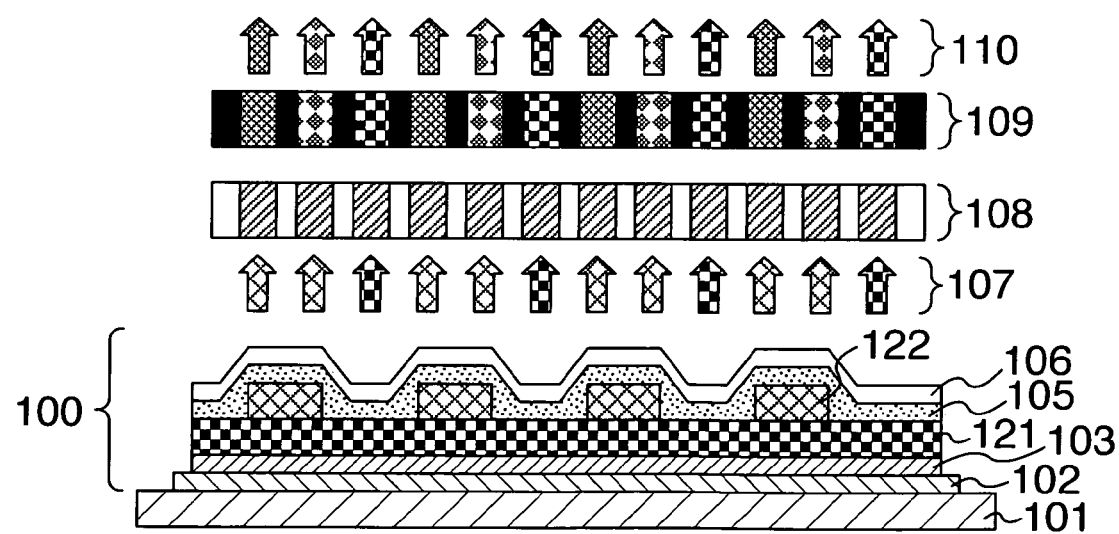
FIG. 4 is a schematic view illustrating a second embodiment of a display device according to the present invention.

FIG. 4 is a schematic view which shows a display device wherein a pattern of an organic EL panel (two-color area pattern organic EL panel) in which organic EL elements having a structure having a long wavelength side luminous film partly formed are patterned in a stripe-like manner on a short wavelength side luminous layer which is formed in the form of a simply flat film is mated with that of light incident ports for an optical shutter function element such as a liquid crystal element. The configuration of the second embodiment is the same as that of the first embodiment, except a blue luminous layer (the short wavelength side light emitting layer) 121 formed of a simply flat film, and a yellow luminous layer (the long wavelength side luminous layer) 122 which is partially formed. The intensity of light 107 from this yellow luminous layer (the long wavelength side luminous layer) 122 is adjusted by the liquid crystal panel 108, and the wavelength thereof is converted by the color filter 109.

The organic EL element structure (the two-color area pattern organic EL panel) shown in FIG. 4 may offer an advantage such that only one fine pattern of a luminous layer is formed, and accordingly, no fine positioning mechanism is required in a film forming apparatus.

Figure 5:
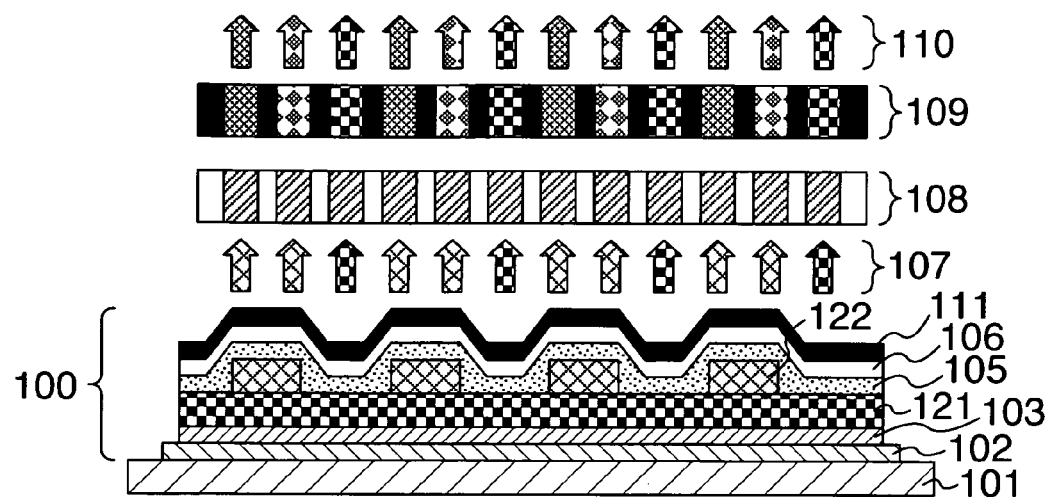
FIG. 5 is a schematic view illustrating the display device in which an organic EL panel 100 shown in FIG. 4 has a resonator structure.

Further, as shown in FIG. 5, with the provision of a protecting film 111 having a semitransparent reflecting function in front of the luminous surface so as to allow the organic EL elements to have a resonator structure, the directivity of luminosity of the organic EL elements may be enhanced so as to enhance the efficiency of light injection into the optical shutter function element, and simultaneously, color adjustment may be made. This protecting film may have a water-proof and moisture-proof function for the liquid crystal panel 108.

Figure 6A:
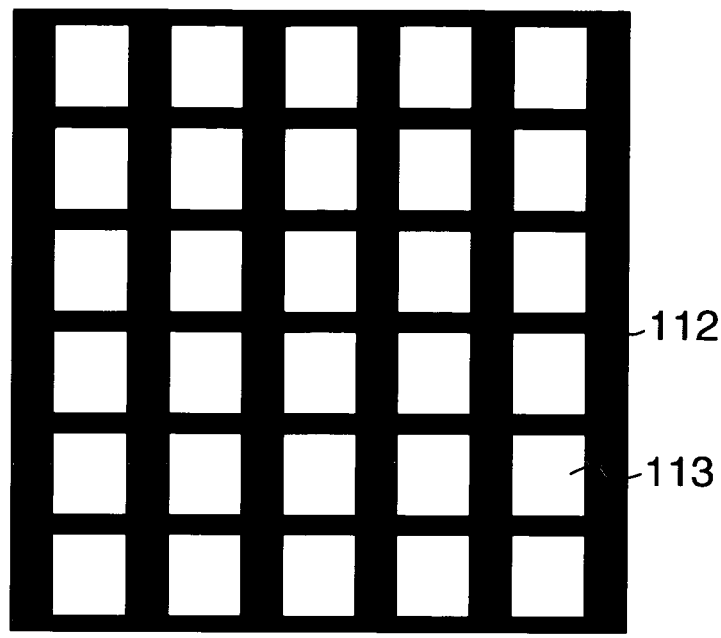
FIGS. 6A and 6B are views illustrating a deposition mask during formation of the organic EL panel 100 shown in FIGS. 4 and 5 by deposition.
Figure 6B:
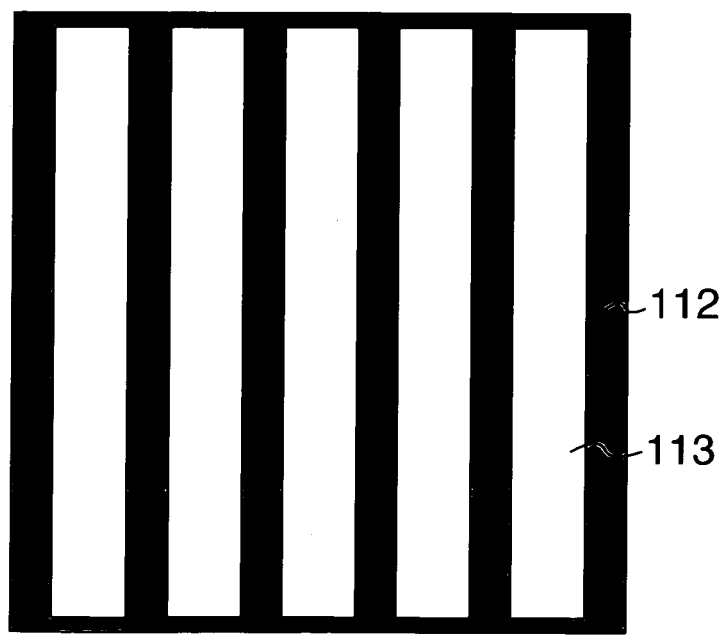

In a method of forming the organic EL panel 100 having a two-color area pattern, shown in FIGS. 4 and 5, with the use of a deposition process, at first, the blue luminous layer 121 is formed in the form of a simply flat film. Thereafter, as shown in FIG. 6A, a mask having apertures of ⅓ or ⅔ is used so as to form a pattern of the long wavelength side luminous layer. As to the mask, as shown in FIG. 6B, a mask which is formed therein with strip-like apertures so as to reinforce the strength of the mask may be used.

Whether the apertures are set to ⅓ or ⅔ is determined as follows: in the case of using the luminosity of the short wavelength side for two colors (B, G) and the luminosity of an additionally formed luminous member for a single color (R), the apertures are set to ⅓. However, in the case of using the luminosity of the short wavelength side for a single color (B) and the luminosity of an additionally formed member for two colors (R, G), the apertures are set to ⅔.

In the organic EL panel 100 having a two-color area pattern, it may be sufficient to generate only long wavelength luminosity to be used as an output, from a part where the short wavelength side luminous layer portion and the long wavelength side luminous layer portion are laminated one upon another. Thus, the element structure may be easily optimized in this case which should be compared with such a case that "white light" is generated, resulting in such an advantage that the luminous efficiency may be enhanced up to a value nearly equal to that of a monochromatic organic EL element.

Further, the following designs are effective for enhancing the luminous efficiency of the display device; (1) a long wavelength side luminous portion is arranged on the front surface side of the luminosity of a short wavelength side luminous portion so as to utilize enhanced PL luminosity, (2) the excitation life is set in a large and small relationship with a short wavelength and a long wavelength (the short wavelength side luminous layer is made of a phosphorescent material having a long excitation life while the long wavelength side luminous layer is made of a phosphorescent material having a short excitation life), and so forth. It is noted that a phosphorescently luminous element which utilizes a triplet-excited state for luminosity has such a property that its excitation life is extraordinarily longer than that of the other elements. That is, any of phosphorescently luminous elements which have been known up to now has a 1/e attenuation characteristic time longer than 1 μsec in the luminous intensity.

The organic EL panel 100 having a color area pattern as shown in FIGS. 1, 2, 4 and 5 may be formed not only by vapor deposition but also by coating with the use of an injection head.

Figure 7:
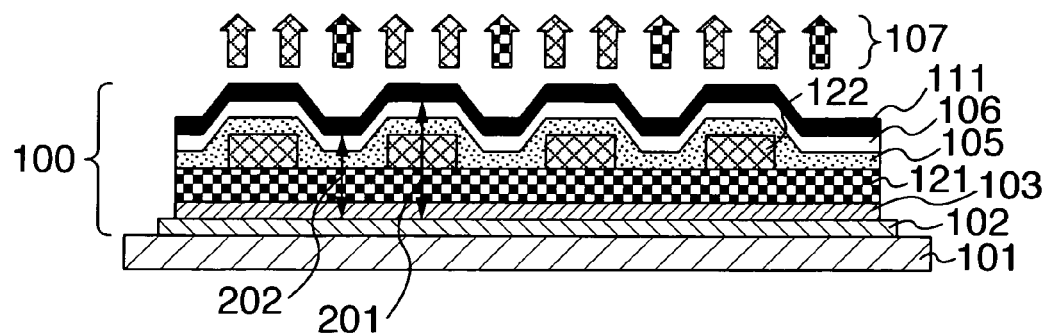
FIG. 7 is an explanatory view for explaining a length of a resonator in an organic EL panel 100 having a two-color area pattern.

As shown in FIG. 7, the organic EL element having a two-color area pattern, and having a resonator structure in which a long wavelength side luminance layer is partly formed may offer a structural advantage.

Referring to FIG. 7, since a resonator length 201 on the long wavelength side is longer than a resonator length 202 on the short wavelength side, usually, the thickness of the transparent electrode film is increased or a transparent buffer layer is provided in order to increase the film thickness. However, in this structure, the resonator length is increased by a value corresponding to the thickness of the partly formed long wavelength side luminous layer portion. That is, there may be easily taken such a design that the resonator length is adjusted to a short wavelength in the short wavelength side luminous portion, and simultaneously, the resonator length is adjusted to a long wavelength in the long wavelength side luminous portion.

For example, in an element having a resonator length equal to one wavelength, if the short wavelength side resonant wavelength is set to 500 nm, the long wavelength side resonant wavelength to 585 nm, and the refractive index of the long wave length side luminous layer to 1.7, the film thickness of the long wavelength side luminous layer potion may be set to (585-500)/1.7/2=25 nm.

Figure 8:
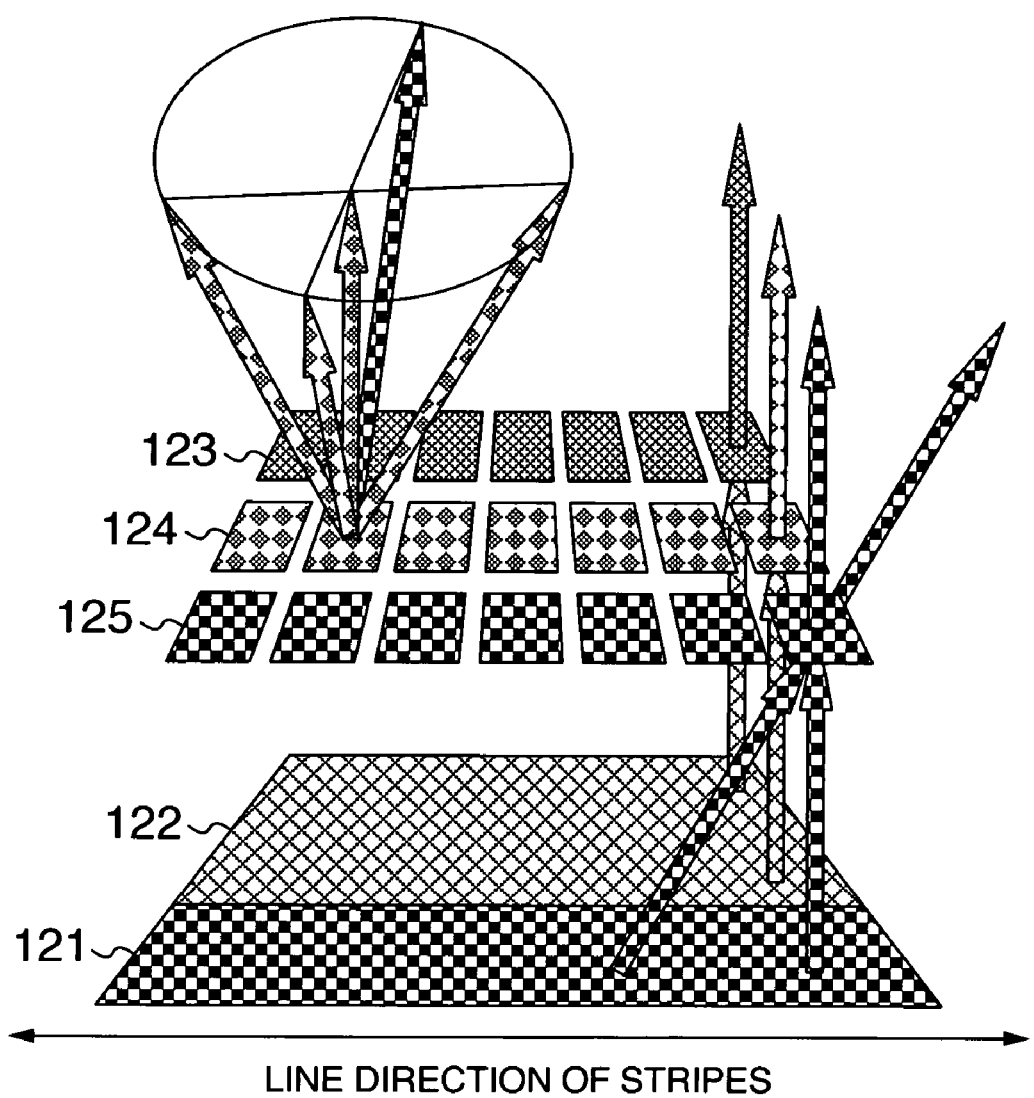
FIG. 8 is a view for explaining a viewing angle in an organic EL panel 100 having a two-color area pattern.

The organic EL element having the color area pattern as stated above, exhibits such a feature that the viewing angle in a line direction of stripes shown in FIG. 8 is larger than that in the direction orthogonal thereto although it is dependent upon a design.

For example, by setting the line direction of the stripes in the luminous layers 121, 122 to be equal to the line direction of the filters 123, 124, 125, the luminosity from the blue luminous layer 121 in the line direction passes through a B filter portion 125, but not only luminosity from a yellow luminous layer 122 but also luminosity from a blue luminous layer 121 in a 90 deg. direction pass through a G filter portion 124. It is noted that reference numeral 123 denotes an R filter portion.

For example, in the case of using the display for a computer, it is effective in almost cases that the line direction of the stripes are set to be transverse. Since the liquid crystal panel is composed of two (or more) of transparent substrates as components, an apparatus configuration in consideration with an angular dependency is important, being dependent upon a rate between "a size or pitches of pixels" and "a thickness of a liquid crystal panel substrate or a space between an organic EL panel and a liquid crystal panel" or the like.

Embodiment 3

Figure 9A:
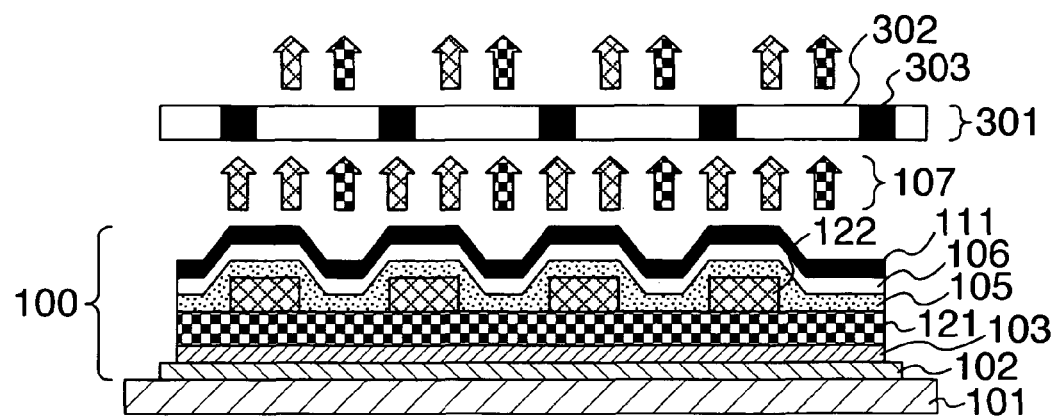
FIGS. 9A and 9B are schematic views illustrating a luminous panel according to the present invention.
Figure 9B:
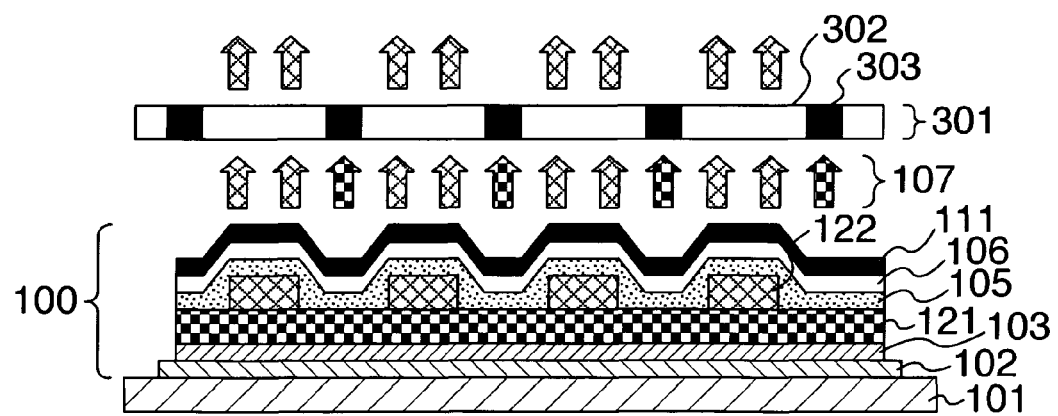

Referring to FIGS. 9A and 9B which schematic views illustrating a luminous panel capable of changing luminous colors with the use of such a configuration that the front surface of the organic EL panel 100 having a two-color area pattern is combined with a transparent plate formed thereon with a mask pattern having the same period as that of the two-color area pattern, instead of a liquid crystal panel or the like, and the superposition thereof is finely adjusted, there are shown a transparent plate 301 with blocking parts 303, and transmission parts 302.

The blocking parts 303 of the transparent panel 301 may use a period which is longer than that of the two-color area pattern by an integer multiple, or a pattern which is randomly thinned. Further, the blocking parts 303 may be semitransparent, that is, the transparent plate 301 with blocking parts may have a transmission rate which periodically changes over the allover area thereof, or may have a color selectivity.

In the configuration shown in FIG. 9A, yellow color is partly cut off and, and in the configuration shown in FIG. 9B, blue color is cut off by transversely shifting the transparent plate 301 with blocking parts, and accordingly there may be shown that output lights of a white green color and a yellow color are obtained. That is, the color tones of the output lights may be changed by shifting the transparent plate 301 with blocking parts, or by being depending upon a condition of the configuration of the transparent plate 301 with blocking parts and the organic EL panel 100.

Also in this embodiment, whether the resonator structure formed with the protecting film 111 having a semitransparent reflecting function is utilized or the protecting film 111 having a semitransparent reflecting function is eliminated is determined, being dependent upon whether the directivity of luminosity is necessarily used or not.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A display device comprising:
   a substrate;
   a substantially planar metal electrode film having a first surface formed on one surface of the substrate and enabling reflection therefrom;
   a substantially planar electron transfer layer made of a thin organic film and having a first surface formed on substantially an entirely of a second surface of said metal electrode film;
   organic thin film luminous layers formed on said electron transfer layer including a substantially flat short wavelength side light emitting layer having a first surface formed over substantially an entirety of a second surface of said electron transfer layer, and a long wavelength side luminous layer partly formed on a second surface of said short wavelength side light emitting layer, said organic thin film luminous layers emitting lights;
   a hole transfer layer made of a thin organic film and formed on said organic thin film luminous layers;
   a transparent electrode formed on said hole transfer layer;
   a liquid crystal panel formed on said transparent electrode and enabling an optical shutter effect so as to adjust an intensity of said emitted lights; and
   a R color filter, a G color filter and a B color filter formed on said liquid crystal panel;
   wherein when viewing from a direction which is normal to the substrate, the substantially planar electron transfer layer which is a single continuous layer, and the transparent electrode which is a single continuous electrode are formed to extend over the R color filter, the G color filter and the B color filter.

2. The display device as set forth in claim 1, wherein said short wavelength side luminous layer is a blue color luminous layer, and said long wavelength side luminous layer is a yellow color luminous layer.

3. The display device as set forth in claim 1, wherein said short wavelength side luminous layer has an excitation life which is longer than an excitation life of said long wavelength side luminous layer.

4. The display device as set forth in claim 1, wherein a luminosity from said short wavelength side luminous layer is a phosphorescent luminosity.

5. The display device as set forth in claim 1, comprising a protecting film having a semitransparent reflecting function and disposed in a laminate manner on said transparent electrode, so as to constitute enable an optical resonator.

6. A display device comprising:
   a substrate;
   a substantially planar metal electrode film having a first surface formed on one surface of the substrate and enabling reflection therefrom;
   a substantially planar electron transfer layer made of a thin organic film and having a first surface formed on substantially an entirety of a second surface of said metal electrode film;
   organic thin film luminous layers formed on said electron transfer layer including a substantially flat short wavelength side light emitting layer having a first surface formed over substantially an entirety of a second surface of said electron transfer layer, and a long wavelength side luminous layer partly formed on a second surface of said short wavelength side light emitting layer, each of said organic thin film luminous layers emitting color lights;
   a hole transfer layer made of a thin organic film and formed on said organic thin film luminous layers;
   a substantially planar transparent electrode formed on said hole transfer layer; and
   a transparent plate having blocking parts which are formed on said transparent plate and which partly block each of said emitted color lights with a period at least equal to that of an at least two color area pattern or longer than a period of the at least two color area pattern by an integer multiple, and transmission parts which transmit each of said emitted color lights; and
   a R color filter, a G color filter and a B color filter formed so as to extend over the substantially planar transparent electrode,
   wherein when viewing from a direction which is normal to the substrate, the substantially planar electron transfer layer which is a single continuous layer and the substantially planar transparent electrode which is a single continuous electrode are formed to extend over the R color filter, the G color filter and the B color filter.

7. The display device as set forth in claim 6, comprising a protecting film having a semitransparent reflection function and disposed in a laminate manner on said transparent electrode, so as to constitute an optical resonator structure between said metal electrode film and said protecting film.

8. The display device as set forth in claim 1, wherein the substantially planar election transfer layer is a substantially flat layer when viewed in cross section.

9. The display device as set forth in claim 6, wherein the substantially planar election transfer layer is a substantially flat layer when viewed in cross section.

10. The display device as set forth in claim 1, wherein said liquid crystal panel has a plurality of pixels,
    wherein when viewing from a direction which is normal to the substrate, a substantially planar electron transfer layer which is a single continuous layer and a transparent electrode which is a single continuous electrode are formed to extend over the plurality of pixels.

* * * * *